United States Patent
Satou et al.

(10) Patent No.: US 7,960,828 B2
(45) Date of Patent: Jun. 14, 2011

(54) CARRIER FRAME FOR ELECTRONIC COMPONENTS AND PRODUCTION METHOD FOR ELECTRONIC COMPONENTS

(75) Inventors: Toshihiko Satou, Niigata (JP); Kazuhiko Takahashi, Niigata (JP); Kazuto Nishida, Osaka (JP); Satoru Waga, Kyoto (JP)

(73) Assignee: Panasonic Corporation, Osaka (JP)

( * ) Notice: Subject to any disclaimer, the term of this patent is extended or adjusted under 35 U.S.C. 154(b) by 254 days.

(21) Appl. No.: 12/246,021

(22) Filed: Oct. 6, 2008

(65) Prior Publication Data
US 2009/0104014 A1  Apr. 23, 2009

(30) Foreign Application Priority Data
Oct. 17, 2007 (JP) ................ 2007-270644

(51) Int. Cl.
*H01L 23/34* (2006.01)
*H01L 23/02* (2006.01)
(52) U.S. Cl. ........ 257/723; 257/678; 257/724; 257/726; 257/727
(58) Field of Classification Search ............ 257/723, 257/726, 727
See application file for complete search history.

(56) References Cited

U.S. PATENT DOCUMENTS

| | | | | |
|---|---|---|---|---|
| 2,738,452 A * | 3/1956 | Heinz | ............. | 257/726 |
| 2,740,075 A * | 3/1956 | Walker et al. | .............. | 257/42 |
| 3,372,310 A * | 3/1968 | Kantor | ............. | 361/728 |
| 5,296,741 A | 3/1994 | Kim | | |
| 6,049,975 A * | 4/2000 | Clayton | ............. | 29/832 |
| 6,082,547 A | 7/2000 | Nentl et al. | | |
| 6,332,946 B1 * | 12/2001 | Emmett et al. | ............. | 156/299 |
| 7,119,436 B2 * | 10/2006 | Lien | ............. | 257/723 |
| 2002/0089056 A1 * | 7/2002 | Eady et al. | ............. | 257/712 |
| 2005/0072715 A1 | 4/2005 | Pylant et al. | | |
| 2007/0114660 A1 * | 5/2007 | Wang | ............. | 257/726 |

FOREIGN PATENT DOCUMENTS
JP  2000-049210  2/2000

* cited by examiner

*Primary Examiner* — Leonardo Andújar
*Assistant Examiner* — Teresa M Arroyo
(74) *Attorney, Agent, or Firm* — McDermott Will & Emery LLP

(57) ABSTRACT

The carrier frame relating to the present invention comprises a base layer member, a frame layer member, and a positioning layer member having multiple openings for storing electronic components. A spring layer member is mounted in a hollow part surrounded by the frame layer member between the positioning layer member and the base layer member. At each opening of the spring layer member, a small spring providing an elastic force for fastening the electronic components between an edge of the corresponding opening of the positioning layer member and the small spring is formed integrally with the spring layer member. At one end in the longitudinal direction of the spring layer member, a large spring providing an elastic force along the longitudinal direction by being in contact with an inner surface of the frame layer member in the mounted state is formed integrally with the spring layer member.

9 Claims, 11 Drawing Sheets positioning layer member frame layer member base layer member spring layer member

CARRIER FRAME FOR ELECTRONIC COMPONENTS AND PRODUCTION METHOD FOR ELECTRONIC COMPONENTS

CROSS-REFERENCE TO RELATED APPLICATION

The present application claims the benefit of Japanese Patent Application No. 2007-270644 filed Oct. 17, 2007, the subject matter of which is incorporated herein by reference.

BACKGROUND OF THE INVENTION

1. Field of the Invention

The present invention relates to a carrier frame that stores and carries electronic components and a production method for electronic components, and the present invention particularly relates to a carrier frame to be used for conveyance of electronic components, such as optical components or semiconductor devices, and a production method for electronic components using the carrier frame in the production process of electronic components.

2. Description of the Related Art

In the production process of electronic components, in order to carry components from a production apparatus used in one process to another production apparatus used in a next process, or in order to make working, such as carrying, input or eject of components within one production apparatus used in one process, easier, a carrier frame is used. Conventionally, the carrier frame stores electronic components in many concave recesses formed in a support plate, and the carrier frame where these electronic components are stored is carried to a production apparatus.

In the case of using the carrier frame, if electronic components are simply stored in the concave recesses arranged in the support plate, the electronic components rattle inside the recesses. If the electronic components rattle within the recesses as described above, the carrier frame and the electronic components may be abraded due to collision between each other and cause dust. For example, when the electronic component is an optical component having an image pickup element, in order to make a light incident into the image pickup element, an optical incident surface of the package is transparent. In this case, when the generated dust attached to the optical incident surface, a problem where the dust is imaged into an image occurs. Further, in a process where a glass cap covers and the image pickup element is sealed within the package, if dust has already been attached to the image pickup element before the glass cap is adhered, it becomes impossible to remove the dust after the glass cap is sealed.

In order to prevent the rattle of the electronic components within the carrier frame, in the prior art, a carrier frame equipped with a means for pressing and retaining electronic components on the occasion of storing the electronic components is proposed. For example, Japanese Laid-Open Patent Publication No. 2000-49210 discloses a carrier frame where a pressing & retention means composed with a positioning unit, a pressing piece and a compression spring is individually arranged to each positioning unit (recess) where many electronic components are stored. In this configuration, the compression spring urges the pressing pieces in a wall surface direction of forming the positioning unit. The electronic components are pressed to the wall surface forming the positioning unit by the pressing piece, and retained. Further, the electronic components are stored or ejected to each positioning unit while the pressing piece is slid to the retention release position by contracting the compression spring.

SUMMARY OF THE INVENTION

In the conventional carrier frame described in the prior art literature, electronic components stored in each positioning unit are pressed and retained by the pressing & retention means arranged in each positioning unit. Consequently, dust at the time of carrying caused by the rattle of the electronic components is controlled. However, the pressing & retention means to the electronic components is arranged in each positioning unit with the number of units of the electronic components, and in addition, this pressing & retention means is formed with at least two or more action components (in the prior art literature, the pressing piece and the compression spring) for individual positioning unit. Therefore, the number of components is great and the structure is complicated, and the carrier frame becomes expensive.

Further, in order to store or eject an individual electronic component in/from the carrier frame, the pressing & retention means established in the positioning unit has to be individually operated in each case, and the storing work and ejecting work of the electronic components become very complicated.

In addition, as described above, because the number components in the pressing & retention means for the electronic components is great, the components are frictioned with each other and abraded on the occasion of action, and it is considered that dust is generated due to this abrasion. In other words, in the carrier frame disclosed in the prior art literature, the dust generation cannot be completely prevented. Therefore, even in the case of using the carrier frame described in the prior art literature for the carrying of optical components, the problem about the dust adhesion cannot be completely eliminated.

The present invention has been accomplished for the purpose of eliminating the prior problem, and the objective is to provide a carrier frame that has a simple structure and can be produced inexpensively, and that can control the dust generation at the time of conveyance, and a production method for electronic components.

In order to accomplish the objective, the present invention has adopted the technical means mentioned below. In other words, the carrier frame for electronic components relating to the present invention that stores and carries multiple electronic components comprises a base layer member, a frame layer member, a positioning layer member and a spring layer member. The base layer member consists of a flat-plate having a rectangular shape in planar view. The frame layer member consists of a frame-like plate having an open end at one end side in the longitudinal direction of the base layer member, and is fixed to one surface of the base layer member. The positioning layer member consists of a flat-plate that has a rectangular shape in planar view, and whose multiple openings for storing electronic components are arranged along the longitudinal direction, and is fixed to the frame layer member opposing to the base layer member. Further, the spring layer member consists of a flat-plate that is mounted in a hollow part surrounded by the frame layer member between the positioning layer member and the base layer member, and that has openings for storing electronic components at positions opposing to each opening of the positioning layer member in the state of being mounted to the hollow part. Further, at each opening of the spring layer member, a first elastic body providing an elastic force for fastening by pressure an electronic component stored via the corresponding opening of the positioning layer member in the state of sandwiching the stored electronic component between an edge of the corresponding opening of the positioning layer member and the first elastic body is formed integrally with the spring layer member so as to protrude inward from one side of each opening of the spring layer member. In addition, at one end of the spring layer member, a second elastic body providing an elastic force in the longitudinal direction of the spring layer member by being in contact with an inner surface of the frame layer member in the state of being mounted to the hollow part is integrally formed with the spring layer member.

According to this configuration, since the number of components for positioning and fastening the multiple electronic components is small and the structure is simple, the carrier frame can be produced inexpensively. Further, since it is configured such that all electronic components are collectively fastened only by an urging force of the spring layer member, storing and ejecting works can be conducted extremely easy. In addition, since each electronic component is collectively fastened, the dust generation due to rattle of the electronic components at the time of carrying can be reduced. In addition, since the spring layer member is formed from a single member, the dust generation due to the friction of the spring layer member can also be reduced. Further, when the spring layer member wears out or is damaged, only the spring layer member should be replaced, and maintenance property is also excellent.

In the carrier frame, preferably, it is configured such that stoppers are formed at both sides of the other end in the longitudinal direction of the spring layer member, and stopper retainers for latching the stoppers are formed on the inner surfaces of the frame layer member at the open end side. According to this configuration, the spring layer member can be easily mounted; concurrently, can be easily detached.

Further, the spring layer member may further comprise a protrusion portion for restricting a deformation amount of the second elastic body. With this configuration, an occurrence of a failure where excess stress is applied to the second elastic body and the second elastic body is plastically deformed and an urging force is deprived can be prevented. In addition, another configuration where each of the openings of the spring layer member is rectangular, and the first elastic body provides the elastic force in a diagonal direction of each opening of the spring layer member can be adopted. With this configuration, a contact area with the electronic components and an inner circumferential surface of the opening to contribute to the retention of the electronic components is increased, and it becomes possible to further securely retain the electronic components.

Further, for the base layer member, a configuration further comprising through-holes that penetrate in the thickness direction at a position corresponding to each opening of the positioning layer member can be adopted. With this configuration, dust that invades from the outside into an empty carrier frame or at the time of storing the electronic components in the carrier frame can be smoothly ejected through the through-holes. Further, because the exposure area of the electronic components is increased, working efficiency on the occasion of cleaning the electronic components stored in the carrier frame together with the carrier frame using a cleaning solution or drying them can be improved.

In addition, for the positioning layer member and the base layer member, a configuration further comprising through-holes that penetrate in the thickness direction at an opposing position from each other can also be adopted. With this configuration, even when the electronic components are stored in the carrier frame and heated therewith, generation of heat deformation can be prevented because of the through-holes. Consequently, for example, on the occasion of dice bonding or wire bonding, even when the carrier frame is mounted onto a pre-heated processing stage and vacuumed for fastening the carrier frame, the carrier frame can be secured by vacuum suction.

Further, when the electronic component has a configuration to seal a cap to a carrier where a semiconductor element is mounted, it is preferable to be configured such that the upper surface position of the positioning layer member is positioned at the upper surface of the carrier stored via the opening of the positioning layer member to be lower by a predetermined height. Consequently, an occurrence of a failure where an adhesive is adhered onto the surface of the positioning layer member on the occasion of adhering and sealing the cap to the carrier where the semiconductor is mounted can be effectively prevented.

In addition, for the frame body composed of the base layer member, the frame layer member and the positioning layer member, a configuration further comprising groove-like identification marks with different number or intervals on a side end according to a type of electronic components to be stored can be adopted. With this configuration, even when there are many types of the carrier frames and electronic components, it becomes possible to identify them, and it results in easy management of the electronic components and the carrier frames.

Furthermore, for the positioning layer member, the frame layer member, the base layer member and the spring layer member, for example, if stainless steel plate is processed by etching, the carrier frame can be formed with high accuracy and inexpensively.

In the meantime, from other viewpoints, the present invention can provide a production method for an electronic component where the electronic component is assembled by using the above-mentioned carrier frame. In other words, in the production method for an electronic component relating to the present invention, first, workpieces to be processed, which are subjects for assembly, are stored in the carrier frame. Next, at least two consecutive assembly processes are implemented under a condition where the workpieces to be processed are stored in the carrier frame.

For example, when the electronic component has a configuration to seal a cap to a carrier where a semiconductor element is mounted, the two consecutive assembly processes are at least two consecutive processes in a process to implement a step of dice bonding the semiconductor element to the carrier, a step of wire bonding to the semiconductor element mounted to the carrier, a cleaning step of dust removal, and a step of adhering and sealing the cap to the carrier. Herein, at least two consecutive processes are processes in association with carrying using the carrier frame, and whether carrying is within the same assembly apparatus or between different assembly apparatuses is no object.

According to the production method for an electronic component, since carrying and assembly can be implemented while the electronic components are stored and fastened in the carrier frame, the production throughput can be improved. Further, since the assembly is conducted while the electronic components are stored in the carrier frame, it is unnecessary to take the electronic components in and out in the middle of process, and dust generation caused by taking the electronic components in and out can also be simultaneously prevented. In addition, it is unnecessary for the assembly apparatus to be equipped with a mechanism to individually position and fasten each electronic component, and cost for the assembly apparatus can be reduced.

In the production method for an electronic component, the two consecutive assembly processes can include a process to be implemented under a condition where a carrier frame in which the workpieces to be processed, which are subjects to be assembled, are stored is secured by vacuum suction onto a processing stage in the assembly apparatus. The process to be implemented under the condition to be secured by vacuum suction onto the processing stage is a process to remove dust by, for example, an ultrasound dry cleaner.

According to the present invention, the carrier frame that can prevent dust generation at the time of carrying can be produced inexpensively with a simple structure. Further, electronic components can be produced without generating dust by producing the electronic components using the carrier frame. As a result, the production yield of the electronic components can be improved. In addition, the production throughput can be improved by producing the electronic components using the carrier frame.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Hereafter, the embodiments relating to the present invention will be described in detail with reference to drawings. Furthermore, in the embodiments, electronic components include semiconductor devices, such as an individualized semiconductor chip or a packaged semiconductor device where a semiconductor chip is mounted, and optical components, such as an imaging device having an image pick up element. Further, the electronic components also include workpieces to be processed in the middle of assembly.

First Embodiment

Figure 2:
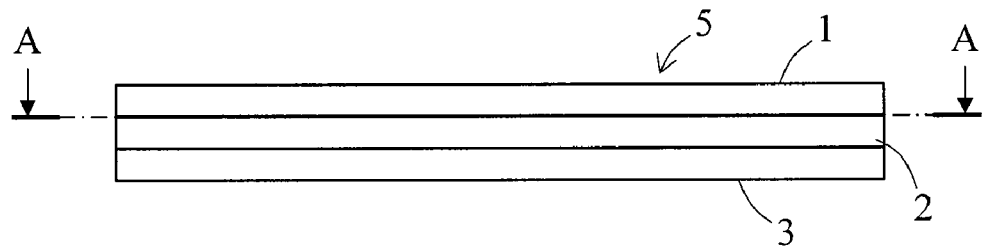
FIG. 2 is a side view showing a carrier frame in the first embodiment relating to the present invention.
Figure 3:
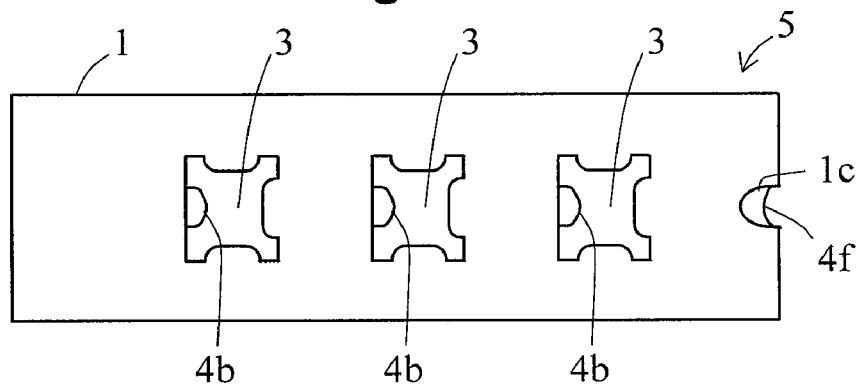
FIG. 3 is a plan view showing a carrier frame in the first embodiment relating to the present invention.
Figure 4:
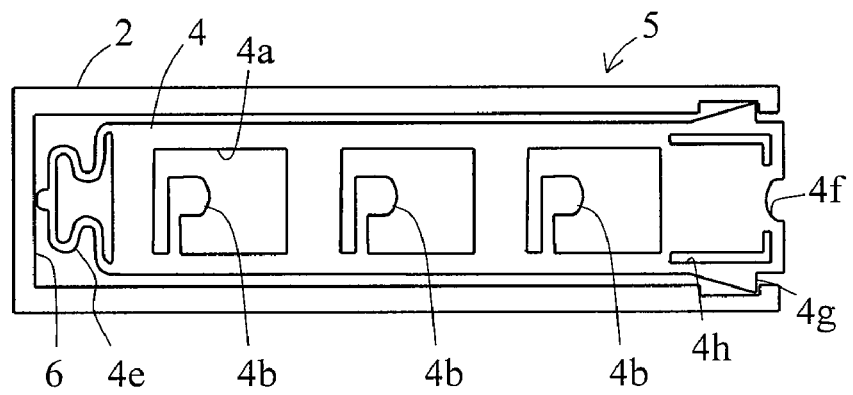
FIG. 4 is a cross sectional view showing a carrier frame in the first embodiment relating to the present invention.

FIGS. 1A to 1D are plan views showing each component of a carrier flame in the first embodiment relating to the present invention. Further, FIG. 2 is a side view showing the carrier frame of this embodiment, and FIG. 3 is a plan view showing the carrier frame of this embodiment. In addition, FIG. 4 is a cross sectional view along the A-A line showing in FIG. 2.

As shown in FIGS. 1A to 1D and FIG. 2, the carrier frame of this embodiment is composed of a positioning layer member 1, a frame layer member 2, a base layer member 3 and a spring layer member 4. For the layer members 1 to 4, for example, an entire shape including an outer shape can be formed by etching processing using thin flat-plate stainless steel, respectively.

Figure 1A:
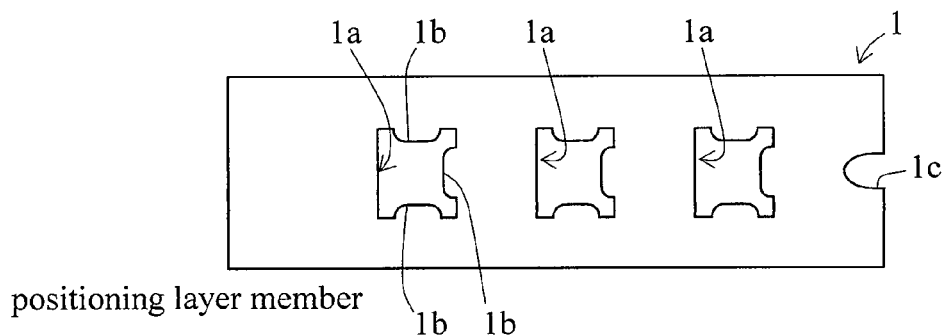
FIGS. 1A to 1D are plan views showing each component of a carrier frame in the first embodiment relating to the present invention.

The positioning layer member 1 is a flat plate-like member having a rectangular outer shape in planar view as shown in FIG. 1A, and multiple openings 1a for storing the electronic components are formed along the longitudinal direction. Component holding pieces 1b protruding inward are formed at three sections around the inner circumference of the opening 1a, respectively. Further, a notch 1c is formed at one end in the longitudinal direction of the positioning layer member 1. Furthermore, the thickness of the positioning layer member 1 is, for example, 0.2 mm.

Figure 1B:
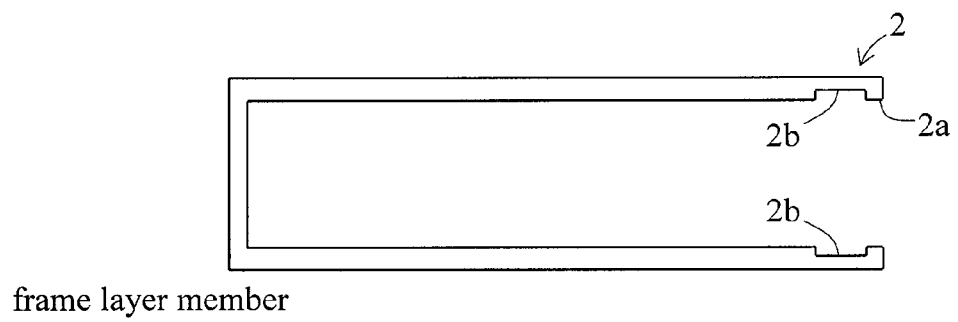

The frame layer member 2 is a frame-like plate member having a roughly the same outer shape as the positioning layer member 1 in planar view as shown in FIG. 1B, and one end side in the longitudinal direction is opening end 2a. Further, concave stopper retainers 2b are formed on the inner surfaces at both sides in the width direction at the side of the opening end 2a. Furthermore, the thickness of the frame layer member 2 is, for example, 0.4 mm.

Figure 1C:
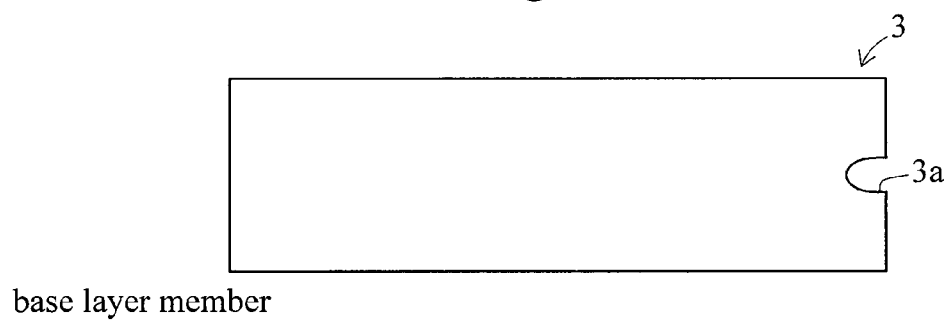

The base layer member 3 is, as shown in FIG. 1C, a flat plate-like member having a roughly same outer shape as the positioning layer member 1 in planar view, and a notch 3a whose shape coincides with the notch 1c of the positioning layer member 1 is formed at one end in the longitudinal direction. Furthermore, the thickness of the base layer member 3 is, for example, 0.3 mm.

The frame body 5 has a structure where the base layer member 3, the frame layer member 2 and the positioning layer member 1 are laminated in order from the bottom, as shown in FIG. 2. The base layer member 3, the frame layer member 2 and the positioning layer member 1 are integrally adhered, for example, by thermal compression bond with each other. Since the frame layer member 2 is a frame-like shape, a hollow part 6 surrounded by the positioning layer member 1 and the base layer member 3 for the top and bottom and by the frame layer member 2 for the circumference is formed inside the frame body 5 (see FIG. 4). The spring layer member 4 is inserted into this hollow part 6.

Figure 1D:
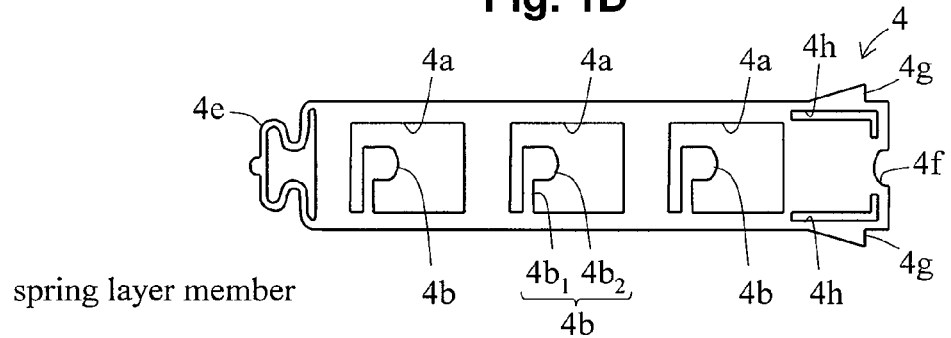

The spring layer member 4 is a component having a function to fasten the electronic components, and in order to be detachable from the hollow part 6 of the frame body 5, the thickness is established to be thinner relatively compared to the thickness of the frame layer member 2. For example, when the thickness of the frame layer member 2 is 0.4 mm, the spring layer member 4 is formed to have 0.3 mm of thickness. Further, in the spring layer member 4, as shown in FIG. 1D, multiple openings 4a are formed along the longitudinal direction by processing a rectangular thin plate member in planar view; concurrently, small springs 4b as a first elastic body are formed to protrude inward from one side of each opening 4a. In this embodiment, the small spring 4b is composed of a rod part 4b, extending inward from the opening 4a and a D-shaped presser $4b_2$ formed at the end of this rod part $4b_1$. Each opening 4a is established by corresponding to each opening 1a of the positioning member 1. Further, as shown in FIG. 3, when the spring layer member 4 is mounted to the frame body 5, the presser $4b_2$ of the small spring 4b and the component holding pieces 1b at the three sections formed in the opening 1a of the positioning layer member 1 protrude from four directions toward the inward of the opening 1a.

In addition, a large spring 4e is formed at one end of the spring layer member 4 in the longitudinal direction as a second elastic body. In this embodiment, the large spring 4e has a structure where S-shaped flexion parts are symmetrically formed in the width direction, respectively, and the spring property is provided by elastically deforming these flexion parts. Further, a notch 4f is formed at the other end of the spring layer member 4; concurrently, wedge-shaped stoppers 4g are protruded and formed outward in the width direction. The notch 4f of the spring layer member 4 is formed so as to have a smaller shape in the longitudinal direction (depth of the notch) compared to the notch 1a of the positioning layer member 1 and the notch 3a of the base layer member 3. In addition, L-shaped cutout portions 4h integrally formed with a slit extending in the longitudinal direction and a slit extending in the width direction (a short side) are formed adjacent to stoppers 4g, respectively.

The small spring 4b provides an elastic force to interpose the square-shaped electronic component by pressing in between one component holding piece 1b (opposing component holding piece 1b) positioned within the opening 1a of the positioning layer member 1. Further, the large spring 4e comes into contact with the inner surface of the frame layer member 2 and provides an elastic force along the longitudinal direction of the frame body 5. Therefore, the urging directions of the small spring 4b of the spring layer member 4 and the large spring 4e coincide with each other.

Figure 5A:
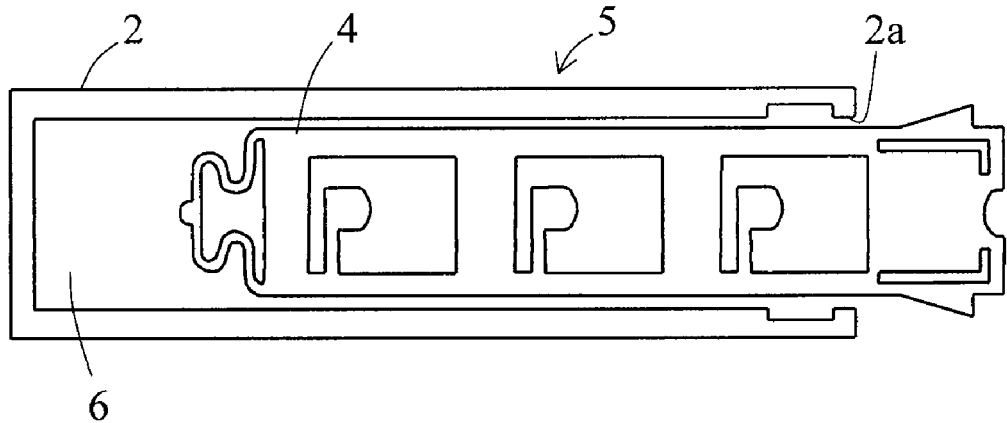
FIGS. 5A to 5C are explanatory diagrams showing a process where a spring layer member of a carrier frame in the first embodiment relating to the present invention is incorporated into a frame body.
Figure 5B:
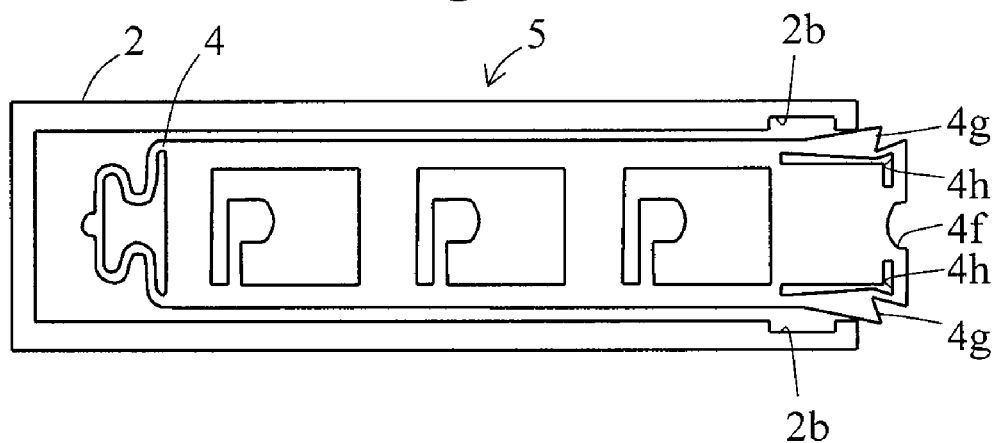
Figure 5C:
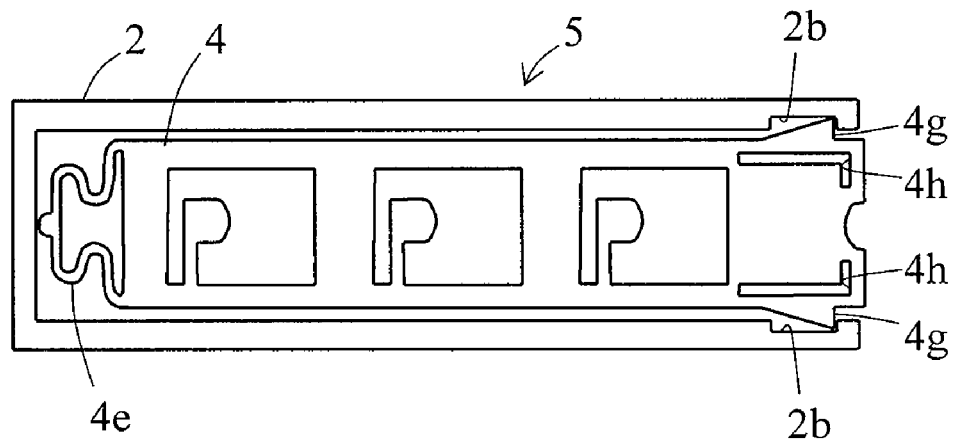

FIGS. 5A to 5C are explanatory diagrams showing a mounting method of the spring layer member 4 to the frame body 5. As shown in FIG. 5A, when the spring layer member 4 is inserted from the open end 2a side of the frame layer member 2 into the hollow part 6 interposed by the positioning layer member 1 and the base layer member 3 of the frame body 5 from the top and the bottom, the inner edge of the frame layer member 2 makes contact with the stopper 4g of the spring layer member 4. When the spring layer member 4 is further pushed toward the inward of the frame layer member 2, as shown in FIG. 5B, the stoppers 4g are elastically deformed by crushing the cutout portions 4h in the vicinity of the stopper 4g due to the elasticity of plate-like member.

When the spring layer member 4 is further pressed inward, as shown in FIG. 5C, the large spring part 4e comes into contact with the inner surface of the end of the frame layer member 2 and is deformed; concurrently, the stoppers 4g reach the portions of the stopper retainers 2b. As described above, since the stopper retainers 2b are concave, the elastically-deformed stoppers 4g become in the free-state, and the shape of the cutout portions 4h is restored. In other words, the stoppers 4g are inserted into the stopper retainers 2b.

On that occasion, the spring layer member 4 is urged toward the open end 2a side of the frame layer member 2; however, because the stopper 4g is latched by the stopper retainer 2b, the spring layer member 4 will not protrude from the frame body 5, but is kept within the hollow part 6. Further, when the stopper 4g of the spring layer member 4 is latched by the stopper retainer 2b, as shown in FIG. 3, a portion of the small spring 4b is exposed through the opening 1a of the positioning layer member 1. In addition, the notch 4f of the spring layer member 4 is exposed from the notch 1c (3a) of the frame body 5.

FIGS. 6A to 6D are explanatory diagrams showing a method of storing electronic components in the carrier frame described above. Before the electronic components are stored in the carrier frame, the spring layer member 4 is mounted to the hollow part 6 of the frame body 5. Consequently, as shown in FIG. 3, a portion of the small spring 4b of the spring layer member 4 is exposed through the opening 1a of the positioning layer member 1; concurrently, the notch 4f is also exposed from the frame body 5.

Figure 6A:
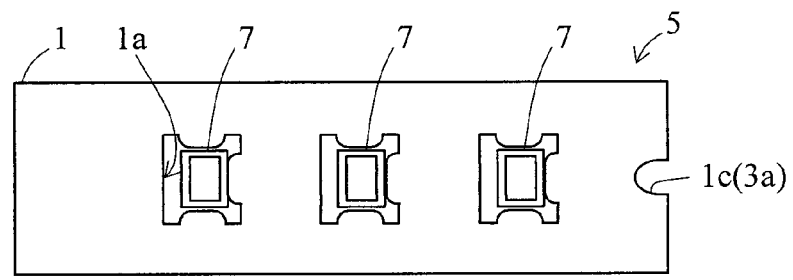
FIGS. 6A to 6D explanatory diagrams showing a process where electronic components are stored in a carrier frame in the first embodiment relating to the present invention.
Figure 6B:
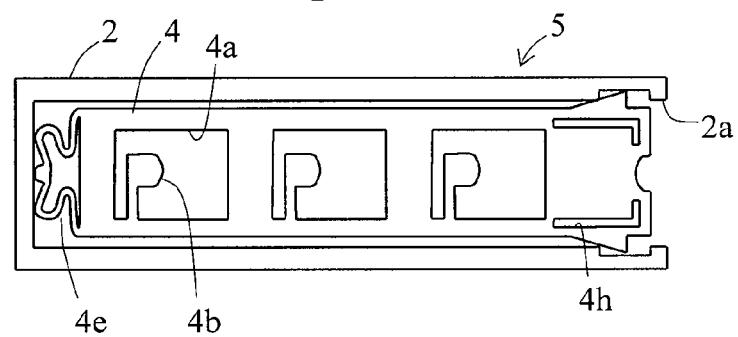

When the electronic components are stored in the carrier frame, first, the notch 4f of the spring layer member 4 exposed from the frame body 5 is pushed toward the inward of the frame body 5. At this time, the small springs 4b enter into the hollow part 6, and as shown in FIG. 6A, they are no longer visible from the opening 1a of the positioning layer member 1 in planar view. FIG. 6B shows the frame layer member 2 and the spring layer member 4 under this condition. As shown in FIG. 6B, the large spring 4e comes into contact with the inner surface of the end of the frame layer member 2 and is deformed due to compression. Further, in this embodiment, at this condition, the opening width of each opening 4a of the spring layer member 4 in the longitudinal direction is greater than the opening width of each opening 1a of the positioning layer member 1 in the longitudinal direction so as to position each opening 1a of the positioning layer member 1 within each opening 4a of the spring layer member 4 in planar view.

While the small springs 4b are no longer visible from the openings 1a of the positioning layer member 1, as shown in FIG. 6A, the electronic components 7 are stored into the opening 1a of the positioning layer member 1. As described above, even under this condition, because the openings 1a of the positioning layer member 1 are overlapped with the openings 4a of the spring layer member 4, the electronic components 7 are stored within the openings 1a and the openings 4a while they make contact with the base layer member 3 exposed through the openings 4a and the openings 1a. Furthermore, when the electronic components 7 have already been stored in the openings 1a, it becomes possible to extract the electronic components 7 from the openings 1a in this condition.

Figure 6C:
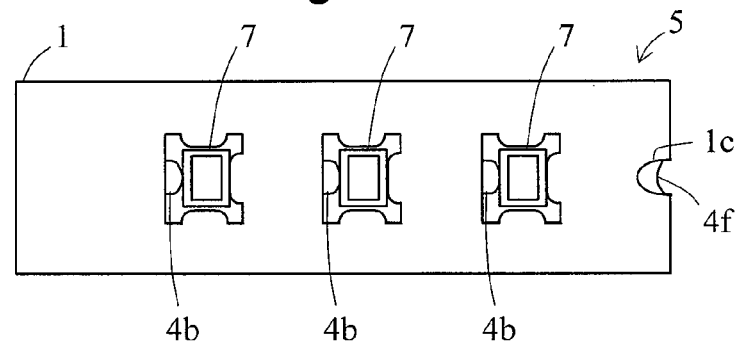
Figure 6D:
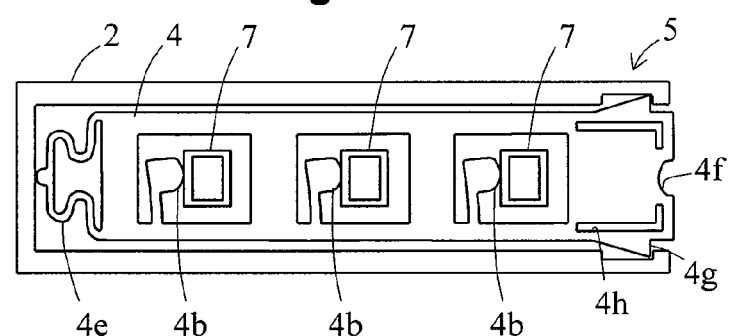

While the electronic components 7 are stored in the carrier frame via the openings 1a of the positioning layer member 1, when the press of the spring layer member 4 is released, due to an urging force caused by the deformation of the large spring 4e by compression, the small springs 4b of each opening 4a move toward the open end 2a side of the frame layer member 2 in association with the movement of the spring layer member 4. Then, as shown in FIG. 6C, the electronic components 7 are interposed and fastened between the small springs 4b and the component holding pieces 1b, respectively. FIG. 6D shows the frame layer member 2 and the spring layer member 4 under this condition. In this embodiment, the presser $4b_2$ substantially makes point contact with electronic components. In this case, the portion exceeding the thickness of the frame layer member 2 from the electronic components 7 shall be held with the component holding piece 1b of the positioning layer member 1. Consequently, in this embodiment, the thickness of the frame layer member 2 is pre-designed to be smaller than the thickness of the electronic components 7 to be stored. Further, when the electronic component 7 is stored within the opening 1a of the positioning layer member 1, respectively, the urging force of the large spring 4e is pre-designed so as not to generate rattle within this opening 1a by certainly pressing each electronic component 7 between the component holding piece 1b of the positioning layer member 1 and the small spring 4b.

On the other hand, the spring layer member 4, as shown in FIG. 5B, can be extracted from the frame body 5 by elastically deforming the stopper 4g of the spring layer member 4 and releasing the latch by the stopper retainer 2b of the frame layer member 2. Therefore, even if the spring layer member 4 wears out (reduction of urging force of the small springs 4b or the large spring 4e) or gets damaged due to the repetition of storage and ejection actions of the electronic components 7, only the spring layer member 4 can be easily replaced.

As described above, the carrier frame of this embodiment has a configuration where the layer members 1 to 4 can be formed with high accuracy by etching, respectively; concurrently, the position layer member 1, the frame layer member 2 and the base layer member 3 are integrated with each other by thermal compression bond and the frame body 5 is formed, and the spring layer member 4 is mounted to this frame body 5 to be detachable. Consequently, since the number of components for positioning and fastening the electronic components 7 can be small and the structure is simple, the carrier frame can be produced inexpensively. Further, because many electronic components can be stored at once, the conveyance of the electronic components becomes easy.

Further, all electronic components stored in the carrier frame can be simultaneously fastened or released collectively by repeating the pressing action of the spring layer member 4 formed with a single member into the frame body 5, many electronic components 7 can be easily stored or ejected.

Further, since each electronic component 7 is certainly fastened within the opening 1a of the positioning layer member 1, the electronic components will never rattle and cause dust generation, and in addition, because movable portions for fastening the electronic component are a few, the dust generation caused by friction of the component members of the carrier frame is extremely low. Consequently, the carrier frame in this embodiment can be preferably used even on the occasion of conveying optical components.

In addition, because the positioning layer member 1, the frame layer member 2 and the base layer member 3 are integrated with each other by thermal compression bond, there is no gap in between each of the layer members 1 to 3, and invasion from in between the dust from each of the layer members 1 to 3 can be prevented. Therefore, it prevents dust that has entered into the gap from flying away again and dust from being diffused into the production apparatus that processes electronic components stored in the carrier frame together with the carrier frame as in the prior art.

In addition, among the production processes of electronic components, there is a treatment process where the electronic components stored in this carrier frame are cleaned with a cleaning solution; however, even after cleaning in this treatment process, the cleaning solution shall not remain in between each of the layer members 1 to 3 comprising the carrier frame, and it is difficult for the moisture to enter into holes and corners, which are the most difficult to be dried in between each of the layer members 1 to 3, the drying efficiency can be improved.

Furthermore, in this embodiment, the carrier frame where multiple electronic components are arranged in a line and stored is exemplified; however, it is also possible to configure a carrier frame where multiple electronic components are arranged in multiple lines and stored. Further, in order to prevent the omission of the spring layer member from the frame body when the electronic components are not stored, the stoppers are formed to the spring layer member and the stopper retainers are formed in the frame layer member. However, even with the configuration where no stoppers and stopper retainers are formed, it is possible to press and fasten electronic components. Further, for the configuration to prevent the spring layer member from omitting the frame body when the electronic components are not stored, any configuration not limiting to the above-mentioned one can be adopted.

Second Embodiment

Figure 7A:
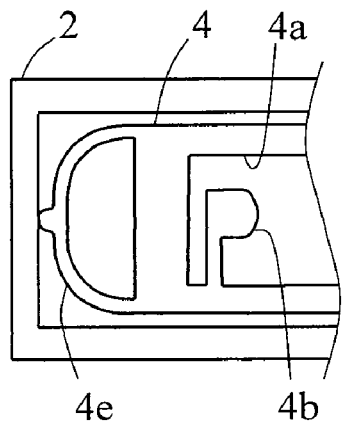
FIGS. 7A to 7C are plan views of primary parts showing a spring layer member of a carrier frame in the second embodiment relating to the present invention.
Figure 7B:
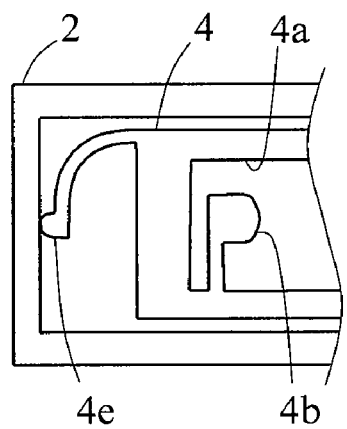
Figure 7C:
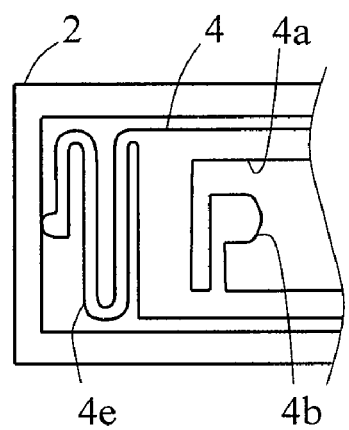

In the first embodiment, as the large spring 4e of the spring layer member 4, the structure where the S-shaped curved parts are symmetrically arranged in the width direction is adopted. However, the large spring is not limited to such structure, but this is realizable with another structure, as well. Then, in this embodiment, the spring layer member 4 having the large spring with a different structure will be described. FIGS. 7A to 7C are plan views of primary components showing the spring layer member 4 of a carrier frame in the second embodiment relating to the present invention. In FIGS. 7A to 7C, the component parts corresponding to the first embodiment are given the same reference numbers.

The large spring 4e, for example, as shown in FIG. 7A, can be formed to be a ship-bottom-like shape. In this configuration, two curved portions extending from the end that make contact with the frame layer member 2 are elastically deformed, and an urging force can be obtained. Further, the large spring 4e, as shown in FIG. 7B, can be configured such that one end of the arc is formed to be a cantilever, and one curved portion (arc portion) is elastically deformed and an urging force can be obtained. In addition, the large spring 4e, as shown in FIG. 7C, can be configured such that one S-shaped end is formed to be a cantilever and three curved portions to form the S-shape are elastically deformed and an urging force can be obtained, as well.

As described above, the shape of the large spring 4e of the spring layer member 4 is variously set, and the spring constant and the maximum flexure of the large spring 4e can be varied. Therefore, if the shape of the large spring 4e is appropriately selected, the urging force by the large spring 4e on the occasion of storing and holding the electronic components 7 can be pre-adjusted.

Third Embodiment

Figure 8A:
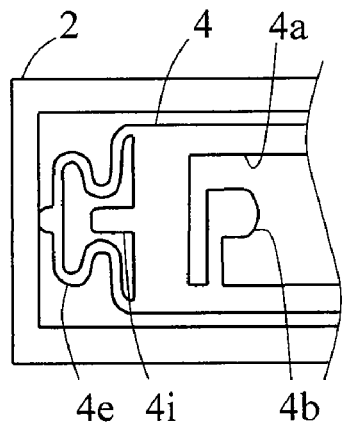
FIGS. 8A to 8C are plan views of primary parts showing a spring layer member of a carrier flame in the third embodiment relating to the present invention.
Figure 8B:
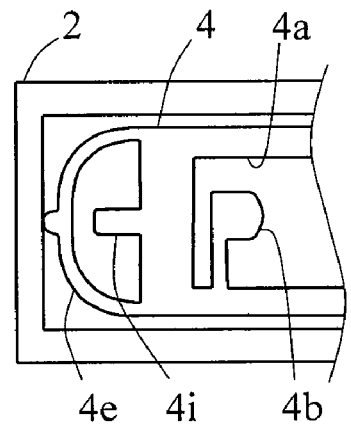
Figure 8C:
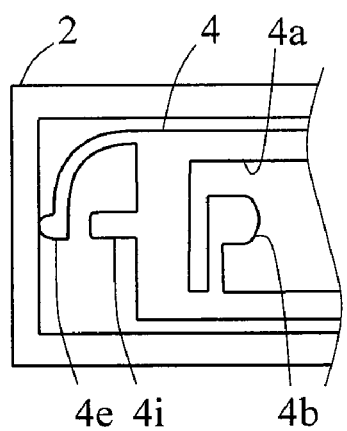

As described in the second embodiment, as the large spring 4e of the spring layer member 4, various structures can be adopted. The spring constant and the maximum flexure of the large spring 4e vary, as described above, depending upon the structure of the large spring 4e; however, on the occasion of pressing the spring layer member 4 into the frame body 5, if a load exceeding the limit of elasticity is applied to the large spring 4e, the large spring 4e is plastically deformed and a predetermined urging force may not be obtained. Then, in this embodiment, a structure of the large spring 4e that can prevent the plastic deformation of the large spring 4e will be described. FIGS. 8A to 8C are plan views of primary components showing the spring layer member 4 of a carrier frame in the third embodiment relating to the present invention. In FIGS. 8A to 8C, the component parts corresponding to the first embodiment are given the same reference numbers.

As shown in FIGS. 8A to 8C, the spring layer member 4 of the present embodiment is equipped with a protrusion portion 4i protruding toward the formation side of the large spring 4e at the base end of the spring layer member 4 supporting the large spring 4e. On the occasion of pressing the spring layer member 4 into the frame body 5, the protrusion portion 4i has a function to come into contact with the elastically-deformed large spring 4e, and to prevent the spring layer member 4 from further pressing into the frame body 5. In other words, the protrusion length of the protrusion portion 4i is set to length where the pressing distance will be within the range of not causing the plastic deformation to the large spring 4e on the occasion of pressing the spring layer member 4 into the frame body 5. Furthermore, FIG. 8A shows the state where the protrusion portion 4i is established in the spring layer member 4 provided with the large spring 4e described in the first embodiment. Further, FIG. 8B shows the state where the protrusion portion 4i is established in the spring layer member 4 equipped with the large spring 4e described with reference to FIG. 7A in the second embodiment, and FIG. 8C shows the state where the protrusion portion 4i is established in the spring layer member 4 equipped with the large spring 4e described with reference to FIG. 7B in the second embodiment.

According to this embodiment, plastic deformation of the large spring 4e on the occasion of pressing the spring layer member 4 into the frame body 5 can be prevented.

Fourth Embodiment

Figure 9:
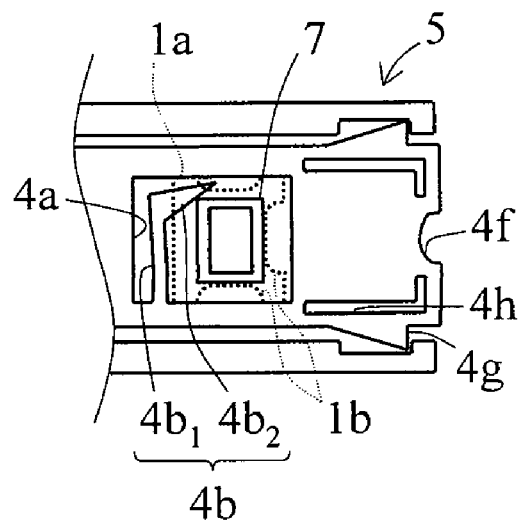
FIG. 9 is a plan view of primary parts showing a spring layer member of a carrier frame in the fourth embodiment relating to the present invention.

In the first embodiment, the example adopting a configuration where the small spring 4b of the spring layer member 4 is composed of the rod part 4b, extending inward from the opening 4a and the D-shaped presser $4b_2$ formed at the end of the rod part 4b, was described. However, the small spring 4b is not limited to such structure but it is realizable with another structure. Then, in this embodiment, the spring layer member 4 having a structure of the small spring, which is different from that in the first embodiment, will be described. FIG. 9 is a plan view of primary components showing the spring layer member 4 of a carrier frame in the fourth embodiment relating to the present invention. In FIG. 9, the component parts corresponding to the first embodiment are given the same reference numbers. Further, in FIG. 9, the opening 1a of the positioning layer member 1 is indicated with a broken line.

As shown in FIG. 9, the spring layer member 4 of this embodiment is composed of the rod part 4b, whose protruding length inward the opening 4a is longer compared to the first embodiment and the presser $4b_2$ formed to be positioned in one corner of the opening 4a. Here, the surface of the presser $4b_2$ making contact with the electronic component 7 is a plane, which is different from that in the first embodiment. According to this configuration, the small spring 4b provides an elastic force in a diagonal direction of the rectangular opening 4a of the spring layer member 4. In other words, the presser $4b_2$ presses the corner of the electronic component 7 toward the diagonal direction, and the electronic component 7 is held between two component holding pieces 1b of the opening 1a of the positioning layer member 1 and the presser $4b_2$.

For example, in the configuration described in the first embodiment where the presser $4b_2$ of the small spring 4b makes point contact with one side of the rectangular electronic component 7, and the electronic component 7 is pressed toward one component holding piece 1b positioned within the opening 1a of the positioning layer member 1 and the electronic component 7 is retained. Therefore, when the electronic component 7 is cleaned with ultrasound cleaning while the component is stored in the carrier frame, it is predicted that the probability for the electronic component 7 to fall off the carrier frame due to the ultrasound oscillation is not also zero.

In the meantime, according to the shape of the small spring 4b of the present embodiment, the presser $4b_2$ of the small spring 4b presses the electronic component 7 toward two component holding pieces 1b and the electronic component 7 is retained, and the possibility for the electronic component 7 to fall off the carrier frame due to the ultrasound oscillation can be further reduced.

Fifth Embodiment

Figure 10:
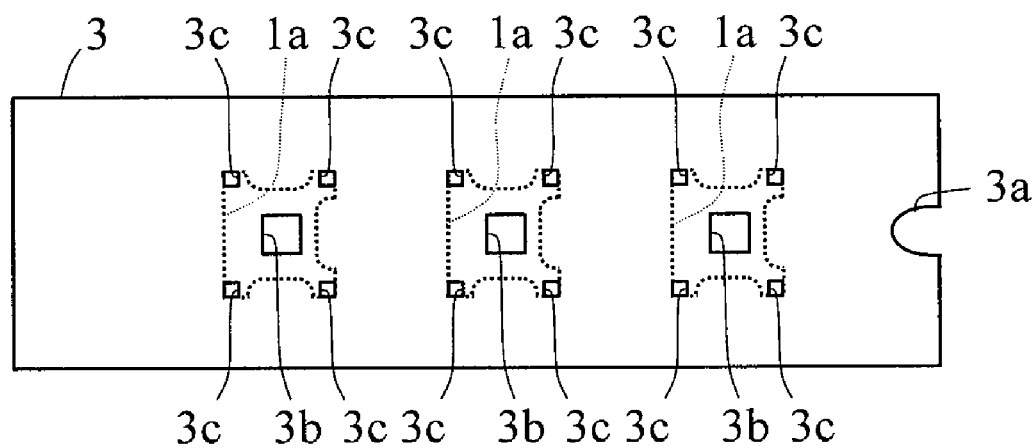
FIG. 10 is a plan view showing a base layer member of a carrier frame in the fifth embodiment relating to the present invention.

In the first embodiment, as shown in FIG. 1C, the rectangular base layer member 3 where no special processing is applied other than the notch 3a is adopted. However, it is also possible to adopt the base layer member 3 having a different structure. FIG. 10 is a plan view showing the base layer member 3 of a carrier frame in the fifth embodiment relating to the present invention. In FIG. 10, the component parts corresponding to the first embodiment are given the same reference numbers. Further, in FIG. 10, the opening 1a of the positioning layer member 1 is indicated with a broken line.

In this embodiment, the base layer member 3 has through-hole 3b passing through the base layer member 3 in the thickness direction at a position corresponding to the center of each opening 1a of the positioning layer member 1. Further, the base layer member 3 has through-holes 3c passing through the base layer member 3 in the thickness direction at positions corresponding to corners of each opening 1a of the positioning layer member 1.

With this configuration, dust that invades from the outside on the occasion of carrying the carrier frame, which has become empty after ejecting the electronic components, to other production process step or on the occasion of storing the electronic components into the empty carrier frame can be smoothly discharged to the outside via the through-holes 3b and 3c of the base layer member 3. Consequently, accumulation of dust within the carrier frame can be prevented.

Further, on the occasion of cleaning the electronic components stored in the carrier frame together with the carrier frame using a cleaning solution, a contact area of the electronic components with the cleaning solution can be increased via the through-hole 3b and 3c, and the contact area of the stored electronic components with high temperature atmosphere within a drying furnace can be increased. Consequently, the working efficiency at the time of cleaning or drying can be improved.

Sixth Embodiment

In the production process of electronic components, assembly processes, such as dice bonding or wire bonding, may be conducted on a processing stage heated at approximately 230° C. On that occasion, if these processes are conducted while multiple electronic components are mounted on the carrier frame, since it is unnecessary to extract or re-store the electronic components in each step, this is advantageous because of the simplification of steps.

However, in the case of the above processing while the electronic components are mounted on the carrier frame, on the occasion of mounting the carrier frame onto the heated processing stage, another problem where the carrier frame rolls back to be arc-like in a concave form will newly occur. As the countermeasure, although it is also possible to fasten the carrier frame by a mechanical means, it is necessary to minimize the count of times of mechanical contacts to the carrier frame as much as possible from the viewpoint of suppressing dust generation. Consequently, it is preferable to suck and secure the carrier frame to the processing stage by exhausting from a vacuum hole established in the processing stage of a die bonder (a die bonding apparatus) or a wire bonder (a wire bonding apparatus) without using any mechanical means. However, with this method, if warpage occurs to the carrier frame due to the thermal deformation, the carrier frame cannot be certainly secured onto the processing stage. Then, in this embodiment, a configuration of a carrier frame that can be certainly secured by vacuum suction onto the processing stage will be described.

Figure 11A:
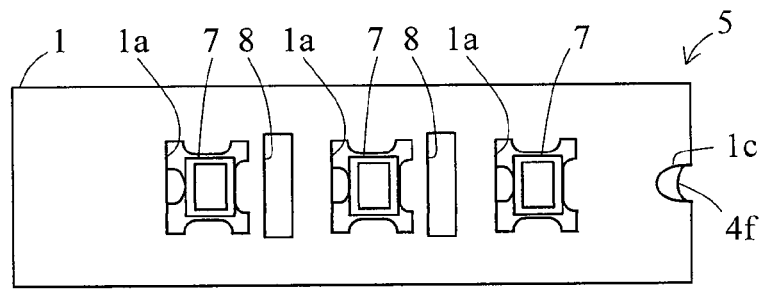
FIGS. 11A and 11B are plan views showing a carrier frame in the sixth embodiment relating to the present invention.
Figure 11B:
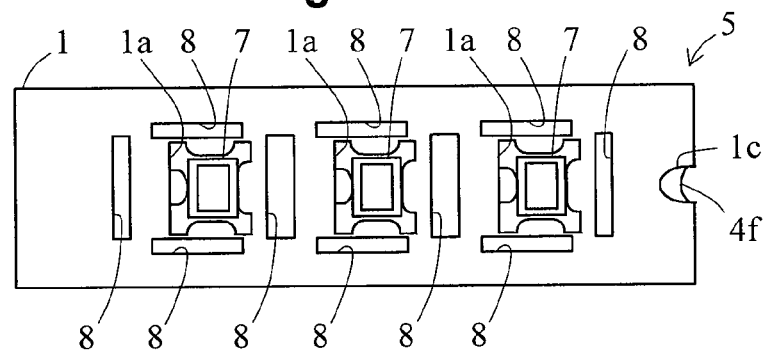

FIGS. 11A and 11B are plan views showing a carrier frame in the sixth embodiment relating to the present invention. In FIGS. 11A and 11B, the component parts corresponding to the first embodiment are given the same reference numbers. As shown in FIGS. 11A and 11B, in this embodiment, slits (through holes) are established to the carrier frame as a countermeasure against thermal deformation. In other words, the carrier flame of the present embodiment is equipped with multiple rectangular slits 8 in the positioning layer member 1 and the base layer member 3 at the opposing positions from each other, respectively. For example, in FIG. 11A, the slits 8 are arranged in between each opening 1$a$ of the positioning layer member 1, respectively. Further, in FIG. 11B, the slits 8 are arranged so as to surround the periphery of each opening 1$a$ of the positioning layer member 1. The number and the size of the slits 8 can be appropriately changed according to the type of electronic components to be carried.

As described above, the establishment of the slits 8 causes the gradual temperature change between the rear surface of the base layer member 3 making contact with the processing stage and the surface of the positioning layer member 1 the further away from the processing stage; concurrently, the heat stress can be lost. As a result, the thermal deformation on the occasion of heating the carrier frame can be prevented.

According to this embodiment, processing, such as dice bonding or wire bonding, can be conducted on the heated processing stage. Further, because the thermal deformation can be prevented, vacuum holes are established in the processing stage and the carrier frame is sucked to the processing stage using vacuum suction and the carrier frame can be secured to the processing stage.

In particular, when the electronic component is an optical component having an optical element, such as an image pickup element or a light emitting/receiving element, a carrier made of ceramics (hereafter, simply referred to as ceramic carrier) may be used as a package component. According to this embodiment, it becomes possible to implement a series of processes, marking to this ceramic carrier, dice bonding for mounting a semiconductor element into the ceramic carrier, wire bonding for wire connection of the semiconductor element with another semiconductor element on the ceramic carrier or wiring on the ceramic carrier, cleaning, drying and adhesion of glass cap, without taking in and out while the electronic component is stored in the same carrier frame.

Seventh Embodiment

Figure 12A:
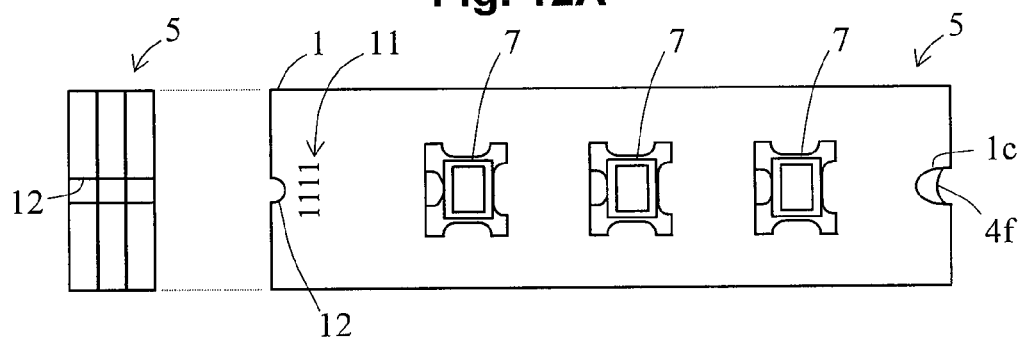
FIGS. 12A and 12B are explanatory diagrams showing a carrier frame in the seventh embodiment relating to the present invention.
Figure 12B:
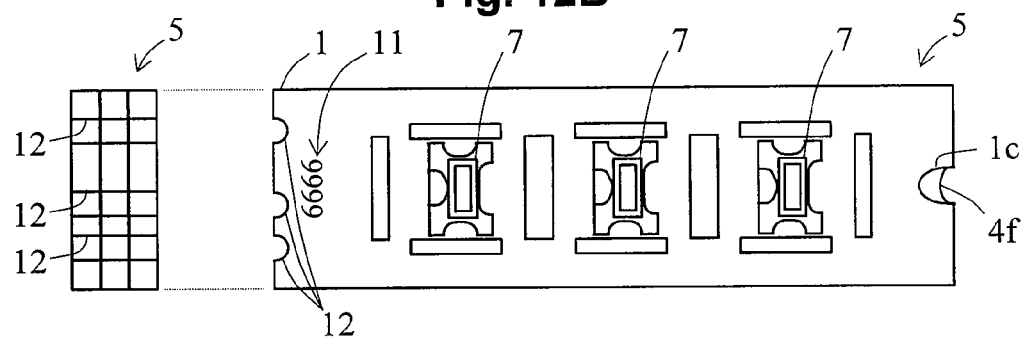

FIGS. 12A and 12B are explanatory diagrams showing a carrier frame in the seventh embodiment relating to the present invention. In FIGS. 12A and 12B, the component parts corresponding to the first embodiment are given the same reference numbers. Furthermore, in FIGS. 12A and 12B, a plan view is shown on the right and a side view is shown on the left, respectively. The carrier frame of this embodiment is characterized by applying identification marks for frame identification.

Specific specifications, i.e., size of the opening 1$a$ of the positioning layer member 1 and position and size of the small spring 4$b$ of the spring layer member 4 vary according to the product type of electronic components to be stored. Consequently, there are as many types of carrier frames as there are product types of electronic components. However, the electronic components often have similar shape, such as a square, and the outer shape dimension is often similar, as well. Therefore, it is difficult to distinguish a product type of the electronic components stored in the carrier frame or a type of the carrier frame from the appearance of the electronic components stored in the carrier frame or a size of the opening 1$a$ of the positioning layer member 1. In particular, the carrier frames may be arranged and stored by temporarily stacking up onto a magazine, in order to make input to each production process step, ejection from each production process step and cleaning easy. In this case, only a side of the carrier frame can be visually viewed, and it is difficult to visually view a dimension & a shape of the electronic components stored in the carrier frames and a marking printed section of each electronic component.

In this embodiment, as shown in FIGS. 12A and 12B, it is designed to enable to easily identify that a certain carrier frame is for storing and carrying which product type of electronic component (or a product type of stored electronic component) by marking with an identification mark 11 where various symbols, such as numbers or Roman characters, on a portion of the frame body 5 of the carrier frame, for example, on the surface at one end side of the positioning layer member 1. Furthermore, the identification mark 11 in this case can be simultaneously inscribed, for example, when the positioning layer member 1 is formed by etching.

In addition, in this embodiment, groove-like identification marks 12 are formed along the thickness direction on the side end surface in the longitudinal direction of the frame body 5. In the case that the groove-like identification marks 12 are established on the side end surface of the flame body 5, even when the carrier flames are temporarily stacked onto the magazine and they are aligned and stored, they are visually identifiable.

For the groove-like identification marks 12, position, the number and intervals can be changed per type of electronic component to be stored. For example, as shown in FIG. 12A, in the case of a carrier flame marked with the identification mark 11 of number "1111", one groove is established in the center of the side end surface of the frame body 5. Furthermore, the carrier flame marked with the identification marks 11 and 12 shown in FIG. 12A is for carrying the electronic components 7 with comparatively large size. Further, slits for anti-warpage due to heating are not established.

In the meantime, as shown in FIG. 12B, in the case of a carrier flame marked with the identification mark 11 of number "6666", as the groove-like identification mark 12, three grooves are established on the side end surface of the frame body 5 in unequal intervals, respectively. Furthermore, the carrier flame marked with the identification marks 11 and 12 shown in FIG. 12B are for carrying electronic components with comparatively small size. Further, slits 8 for anti-warpage due to heating are established.

As described above, with the carrier frame of this embodiment, it is possible to identify a type of each carrier frame by visually observing the identification marks 12 even in the case of aligning and storing by temporarily stacking on the magazine. Consequently, which product type of electronic component is stored in the magazine, or whether or not electronic components with different product types are stored can be easily confirmed visually, and the management of electronic components and carrier flames becomes easy.

Eighth Embodiment

Subsequently, a production method for electronic components using the carrier frame as described above will be described. Hereafter, the electronic component is an optical component having an optical element, a ceramics carrier and a cap made of glass. The optical component is produced by sealing the ceramics carrier where optical element is mounted with the cap.

Figure 13A:
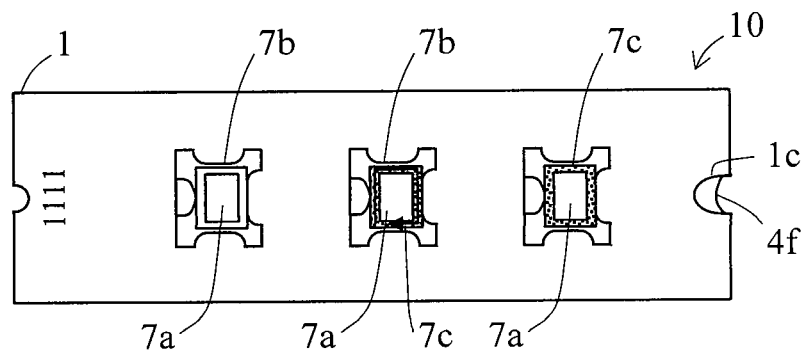
FIGS. 13A and 13B show production processes of electronic components in the eighth embodiment relating to the present invention.
Figure 13B:
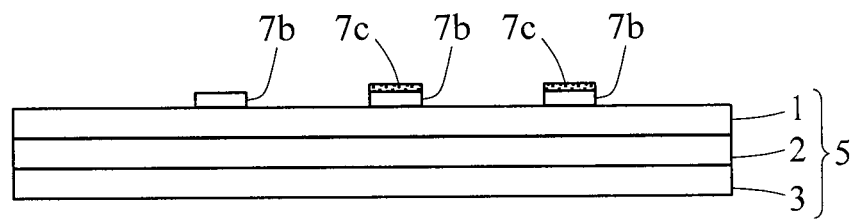
Figure 14A:
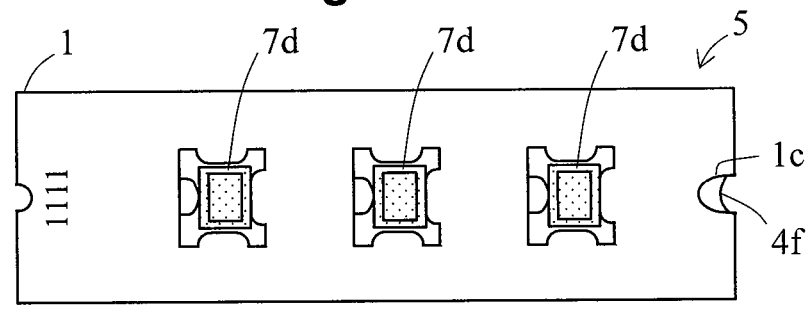
FIGS. 14A and 14B show production processes of electronic components in the eighth embodiment relating to the present invention.
Figure 14B:
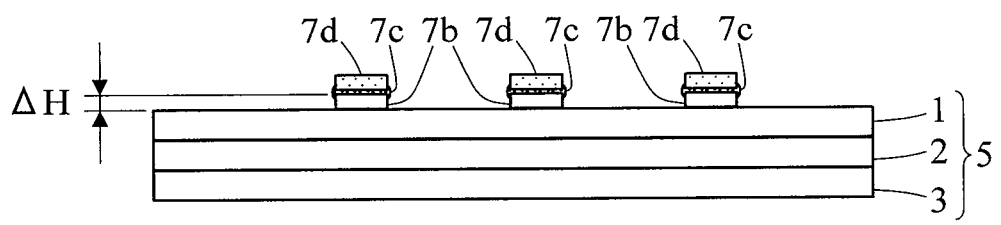

FIGS. 13A and 13B show a part of production process of electronic components using the carrier frame. FIG. 13A is a plan view, and FIG. 13B is a side view. Further, FIGS. 14A and 14B show a part of production process following the process shown in FIGS. 13A and 13B. FIG. 14A is a plan view, and FIG. 14B is a side view. In FIGS. 13A, 13B, 14A and 14B, the component parts corresponding to the first embodiment are given the same reference numbers.

FIGS. 13A, 13B, 14A and 14B show a series of processes for sealing a ceramic carrier 7b where an optical element 7a is mounted with a glass cap 7d, respectively. FIGS. 13A and 13B show a process of coating an adhesive 7c along the opening edge of the ceramic carrier 7b, and FIGS. 14A and 14B show a process of arranging the glass cap 7d on the ceramic carrier 7b.

As shown in FIGS. 13A and 13B, the ceramic carriers 7b where optical elements, such as image pickup elements or photodiodes, are dice-bonded, are stored in the carrier frame 10. The optical elements 7a on the ceramic carriers 7b are completely cleaned and wire-bonded in the state where they are stored in the same carrier frame 10. Then, in this process, as shown in the centers of FIGS. 13A and 13B, respectively, a not-shown dispenser moves relatively along the opening edge of the ceramic carrier 7b, and the adhesive 7c is applied to the entire circumference of the opening edge. In this process, the same process is simultaneously conducted to all of the ceramic carriers 7b stored in the carrier frame 10; however, in FIGS. 13A and 13B, for the purpose of explanation, the process is conducted in order of right end, center and left end, and these diagrams show that an application of adhesive 7c is performing to the ceramic carrier 7b in the center.

When the adhesive 7c is applied to the opening edge of all of the ceramic carriers 7b on the carrier frame 10, as shown in FIGS. 14A and 14B, the glass caps 7d are arranged as overlapped onto the ceramic carriers 7b; concurrently, they are pressed, and the glass gaps 7d are adhered, respectively. With this process, the optical elements 7a are sealed within the ceramic carriers 7b, respectively.

When the glass caps 7d are overlapped and pressed onto the adhesives 7c applied to the entire circumference of the opening edge of the ceramic carrier 7b, the adhesive 7c shall be flared out. In this embodiment, in order to prevent the flared out adhesive 7c from attaching the surface of the positioning layer member 1, the thickness of the positioning layer member 1 and the flame layer member 2 is optimized.

In other words, the position of the surface of the positioning layer member 1 is lower than the position of the upper surface of the ceramic carrier 7b and is pre-set so as to generate a step difference ΔH (see FIG. 14B). For example, when 0.2 mm of the step difference ΔH is established, the dimension where the thickness of the positioning layer member 1 and the thickness of the frame layer member 2 are added should be set by 0.2 mm smaller than the thickness of the ceramic carrier 7b.

As described above, according to this embodiment, it becomes possible to implement a series of processes relating to the adhesion of the glass caps while the electronic components are stored in the same carrier frames. Consequently, the production throughput can be improved. Further, since the assembly is conducted while the electronic components are mounted on the carrier frame, it is unnecessary to take the carriers on the carrier frame in and out in the middle of process and dust generation caused by taking the carriers in and out can be simultaneously prevented. In addition, it is unnecessary for the assembly apparatus to be equipped with a mechanism for individually positioning and fastening each carrier, and the cost for the assembly apparatus can be reduced.

Ninth Embodiment

Figure 15A:
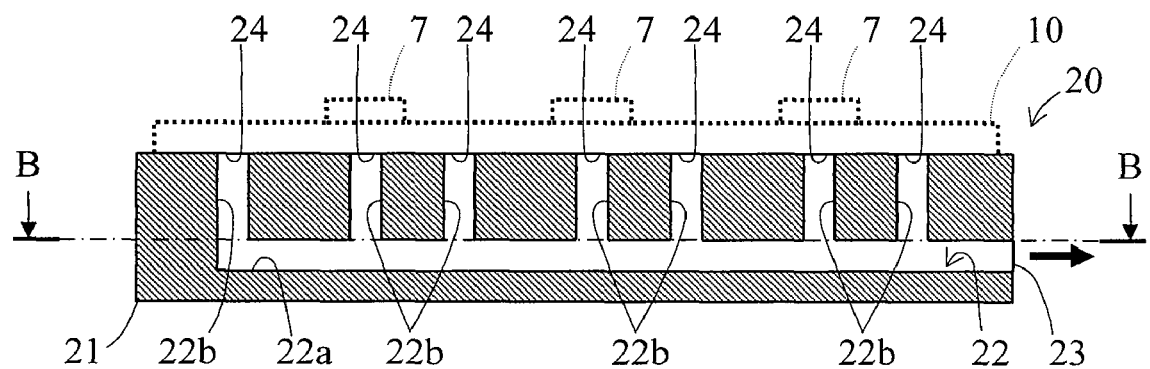
FIGS. 15A and 15B show a processing stage in the ninth embodiment relating to the present invention.
Figure 15B:
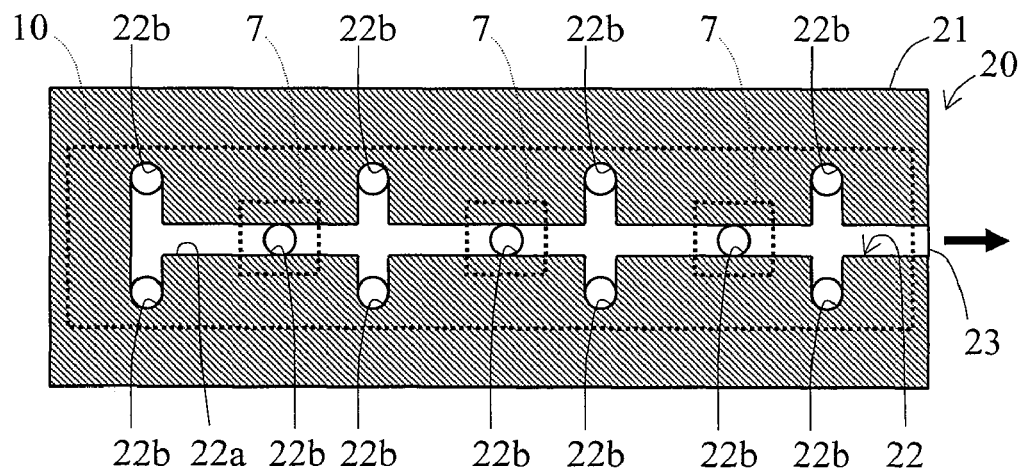

FIGS. 15A and 15B show a processing stage for positioning and fastening a carrier frame in the case of conducting various processes while electronic components are mounted in the carrier frame. FIG. 15A is a longitudinal sectional view, and FIG. 15B is a transverse sectional view in the B-B line shown in FIG. 15A.

When semiconductors or optical elements are dice-bonded or wire-bonded to carriers or caps are adhered onto the carriers while the electronic components are stored in the carrier frame 10, the processing stage having a configuration shown in FIGS. 15A and 15B can be preferably used as a processing stage of assembly apparatus to be used in each process.

In other words, a vacuuming pipe 22 is formed within a support pedestal 21 in a processing stage 20. The vacuuming pipe 22 has a main pipe 22a and branch pipes 22b. The main pipe 22a extends toward the longitudinal direction of the support pedestal 21 and its end communicates into a vacuum port 23 formed on the end surface of the support pedestal 21. Further, one end side of the branch pipe 22b communicates into a suction port 24 opened on the surface of the support pedestal 21, and the other end side communicates into the main pipe 22a, respectively. Then, when the inside of the vacuuming pipe 22 becomes negative pressure by exhausting air via the vacuum port 23, the carrier frame 10 mounted on the support stage 21 is suctioned by the suction port 24, and secured by vacuum suction onto the surface of the support pedestal 21.

By using the processing stage 20 with this configuration, the carrier frame 10 where the electronic components 7 are stored can be secured by vacuum suction onto the processing stage 20. Further, on the carrier frame 10, since individual electronic component is aligned in the positioned state, multiple electronic components are simultaneously positioned by fastening the carrier frame 10 onto the processing stage 20. Consequently, the assembly apparatus does not have to be equipped with a mechanism for individually positioning and fastening each electronic component, and the cost for the assembly apparatus can be reduced. Further, since the time to fasten and release the electronic components can be omitted, the production throughput can be improved.

Tenth Embodiment

Figure 16:
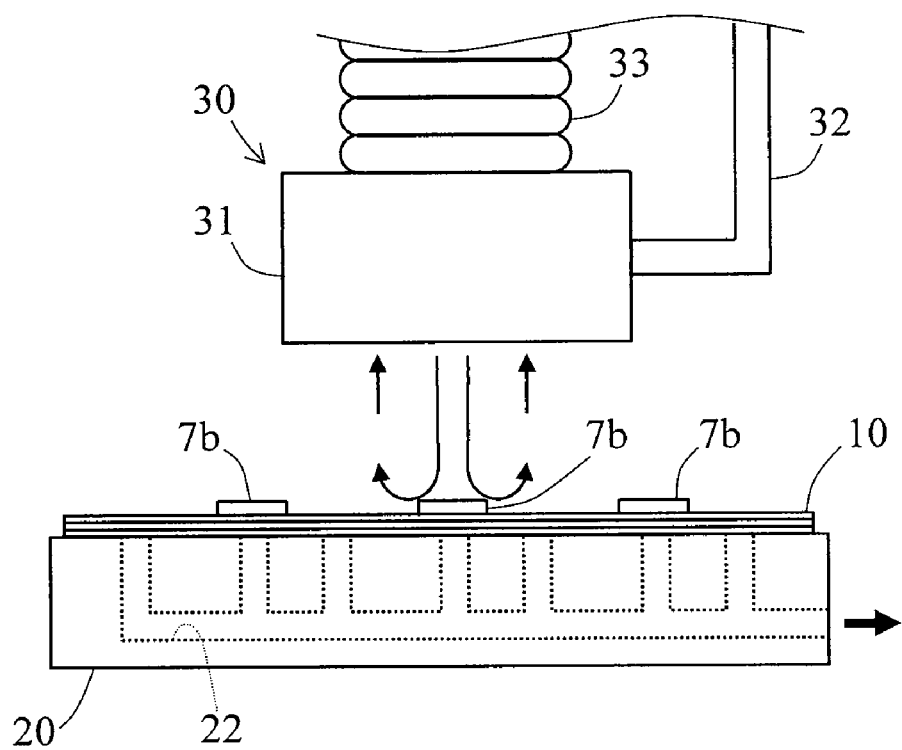
FIG. 16 is an explanatory diagram showing cleaning using an ultrasonic dry cleaner in the tenth embodiment relating to the present invention.

In this embodiment, cleaning by using an ultrasonic dry cleaner, which is one example of process to be implemented while a carrier frame is secured by vacuum suction onto the processing stage described in the ninth embodiment, will be described. FIG. 16 is an explanatory diagram showing the state of cleaning using the ultrasonic dry cleaner. Further, FIG. 17 is a perspective view showing the configuration of the ultrasonic dry cleaner.

On the occasion of carrying electronic components or various assembly processes of electronic components using the carrier frame 10, there is a case that it may be preferable to clean the electronic components and the carrier frame to be mounted before various assembly processes because dust may invade.

For example, as described in the eighth embodiment (FIGS. 13A, 13B, 14A and 14B), when an adhesive is applied to the ceramic carriers 7b and glass caps 7d are adhered while ceramic carriers 7b where optical elements 7a, such as an image pickup elements or photodiodes, are mounted onto the carrier frame 10, after the adhesion with the glass caps 7d, it becomes impossible to remove dust sealed within the ceramic carrier 7b. Consequently, the ceramic carriers 7b and the optical elements 7a are cleaned immediately before adhering with the glass caps 7d.

Figure 17:
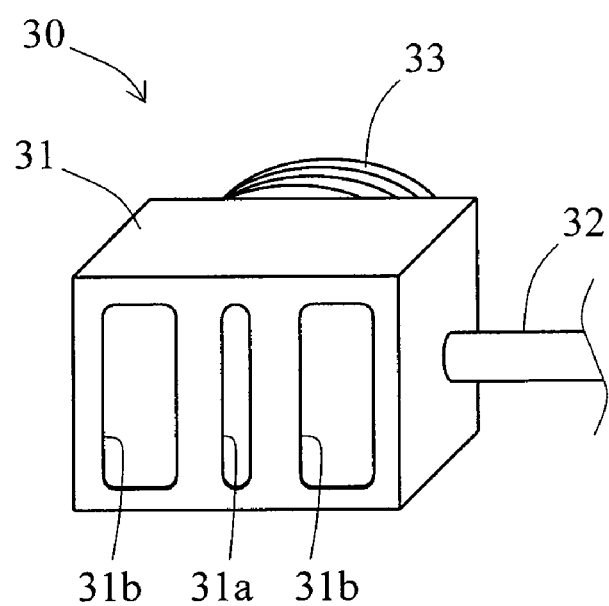
FIG. 17 is a perspective view showing an ultrasonic dry cleaner.

For the cleaning, an ultrasonic dry cleaner 30 shown in FIGS. 16 and 17 can be used. The ultrasonic dry cleaner 30 is established within the glass cap adhesive apparatus that implements adhesion of glass caps described in the eighth embodiment. The glass cap adhering apparatus is equipped with the processing stage 20 with the configuration described in the ninth embodiment, and cleaning is implemented while the carrier flame 10 is secured by vacuum suction onto the processing stage 20.

As shown in FIG. 16 and FIG. 17, the ultrasonic dry cleaner 30 is equipped with a cleaner head 31. A high-pressure air pipe 32 that supplies high-pressure air and an air discharge pipe 33 that suctions and discharges air containing dust are connected to the cleaner head 31. The cleaner head 31 has a not-shown ultrasonic oscillator built-in. Also, as shown in FIG. 17, the cleaner head 31 is equipped with a discharge port 31a for discharging high-pressure air where an ultrasonic oscillation is provided and a suction port 31b for sucking air that is discharged from the discharge port 31a and contains blown-off dust.

The glass cap adhering apparatus spurts high-pressure air, where the ultrasonic oscillation is provided, toward the carrier frame 10 from the discharge port 31a of the cleaner head 31 while the carrier flame 10 is secured by vacuum suction to the processing stage 20, and blows away the dust attached to the optical elements, the ceramic carriers 7b and the carrier flame 10. On this occasion, air containing the blown-off dust is sucked to the suction port 31b and discharged to the outside via the air discharge pipe 33. On that occasion, the dust on the entire surface of the carrier frame 10 can be peeled off and removed by moving and scanning the cleaner head 31 or the processing stage 20.

When the ultrasonic dry cleaner 30 with this configuration is applied, because cleaning can be implemented while the multiple electronic components are mounted to the carrier frame 10, a mechanism for individually positioning and fastening each electronic component is not required as in the prior art. Consequently, the cost for the apparatus can be reduced. Further, since no mechanism for individually positioning and fastening electronic component is established, airflow of high-pressure air to be discharged or air to be sucked will never be inhibited, and a cleaning effect will not be decreased.

Furthermore, in this embodiment, the case of cleaning the ceramic carriers 7b where optical elements are mounted is described; however, this embodiment is not limited to this case, but even when other electronic components are stored to the carrier frame 10, cleaning can be implemented.

Further, in the tenth embodiment, the case where the ultrasonic dry cleaner 30 is applied and the electronic components are cleaned is described; however, even in the case of cleaning and drying the electronic components with an organic solvent, it is possible to clean and dry the electronic components while they are carried in a cleaning apparatus or a drying furnace in the condition where the electronic components are stored in the carrier frame of the present invention.

As described above, according to the present invention, the carrier frame that can prevent dust generation at the time of conveyance can be produced inexpensively with a simple structure. Further, when electronic components are produced using the carrier frame, the electronic components can be produced without generating dust. As a result, the production yield of the electronic components can be improved. In addition, the production of electronic components using the carrier frame enables the improvement of production throughput.

Furthermore, each embodiment described above will not limit the technical scope of the present invention, but they are variously modifiable and applicable within the scope of the present invention even other than the embodiments described above. For example, not limiting to the exemplified assembly process, if consecutive two assembly processes are implemented in association with carrying while workpieces to be processed, which will be electronic components, are stored in the carrier frame of the present invention, the production throughput can be improved compared to the prior art; concurrently, a production process where the dust generation is inhibited compared to the prior art can be realized.

The present invention has an effect to prevent the dust generation at the time of carrying, and it is useful as a carrier frame and a production method for electronic components.

What is claimed is:

1. A carrier frame for storing and carrying multiple electronic components, comprising:
    a base layer member being a flat-plate having a rectangular shape in planar view;
    a frame layer member fixed on one surface of the base layer member and being a frame-like plate having an open end at one end side in a longitudinal direction of the base layer member;
    a positioning layer member fixed to the frame layer member, being opposed to the base layer member, being a flat plate having a rectangular shape in planar view and having multiple openings established along the longitudinal direction; and
    a spring layer member mounted in a hollow part surrounded by the frame layer member, the positioning layer member and the base layer member, and being a flat-plate having multiple openings which are respectively opposed to the openings of the positioning layer member, one of the electronic components being stored in a set of one of the openings of the positioning layer member and one of the openings of the spring layer member opposing to each other,
    the spring layer member comprising:

a first elastic body protruding inward from an inner side surface of each of the openings of the spring layer member and providing an elastic force for fastening the electronic component by sandwiching the electronic component stored in the set of the openings between an edge of the opening of the positioning layer member and the first elastic body; and a second elastic body formed at one end of the spring layer member in the longitudinal direction and providing an elastic force in the longitudinal direction of the spring layer member by being in contact with an inner surface of the frame layer member.

2. A carrier frame according to claim 1, wherein:
the spring layer member further comprises stoppers protruding outward from both sides of another end of the spring layer member in the longitudinal direction, and
the frame layer member further comprises stopper retainers being concave on an inner surface of both sides on the opening end side of the frame layer member, the stopper retainers latching the stoppers and keeping the spring layer member in the hollow part even in a case where the electronic components are dismounted from the set of the openings.

3. A carrier frame according to claim 1, wherein the spring layer member further comprises a protrusion portion located on a base of the second elastic body of the spring layer member, protruding toward the second elastic body from the base, and restricting deformation amount of the second elastic body by contacting with the second elastic body.

4. A carrier frame according to claim 1, wherein each of the openings of the spring layer member is rectangular, and the first elastic body provides the elastic force in a diagonal direction of each opening of the spring layer member.

5. A carrier frame according to claim 1, wherein the base layer member further comprises through-holes penetrating the base layer member in a thickness direction at a position overlapping to each of the openings of the positioning layer member.

6. A carrier frame according to claim 1, wherein:
the positioning layer member further comprises through-holes penetrating the positioning layer member in a thickness direction at a position adjacent to each of the openings of the positioning layer member, and
the base layer member further comprises through-holes penetrating the base layer member in a thickness direction, each of the through-holes of the base layer member being opposed to each of the through-holes of the positioning layer member respectively.

7. A carrier frame according to claim 1, wherein the electronic component comprises a semiconductor element, a carrier on which the semiconductor element is mounted and a cap which is provided on the carrier and seals the semiconductor element, and a position of an upper surface of the positioning layer member is configured to be lower than a position of an upper surface of the carrier stored in the set of openings by a predetermined height.

8. A carrier frame according to claim 1, wherein a frame body comprising the base layer member, the frame layer member and the positioning layer member has, on a side end thereof, one or more grooves to be used for identifying a type of the electronic component stored in the set of the openings based on a number of the grooves or intervals of the grooves.

9. A carrier frame according to claim 1, wherein the positioning layer member, the frame layer member, the base layer member and the spring layer member are formed by etching stainless steel plate.

* * * * *